(12) United States Patent
Khoo et al.

(10) Patent No.: US 11,017,820 B1
(45) Date of Patent: May 25, 2021

(54) ELECTROMAGNETIC SHIELDING FOR ELECTRONIC DEVICES

(71) Applicant: Seagate Technology LLC, Cupertino, CA (US)

(72) Inventors: Peng Boon Khoo, Singapore (SG); Xiong Liu, Singapore (SG); Li Hong Zhang, Singapore (SG)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/797,749

(22) Filed: Feb. 21, 2020

(51) Int. Cl.
  *G11B 33/14* (2006.01)
  *H05K 5/03* (2006.01)
  *H05K 9/00* (2006.01)
  *G11B 25/04* (2006.01)

(52) U.S. Cl.
  CPC ........ *G11B 33/1493* (2013.01); *G11B 25/043* (2013.01); *G11B 33/1466* (2013.01); *H05K 5/03* (2013.01); *H05K 9/0009* (2013.01); *H05K 9/0015* (2013.01)

(58) Field of Classification Search
  None
  See application file for complete search history.

(56) References Cited

U.S. PATENT DOCUMENTS

| | | | | |
|---|---|---|---|---|
| 4,575,578 A * | 3/1986 | Bogan et al. | ........ | H05K 9/0015 277/920 |
| 4,968,854 A * | 11/1990 | Benn, Sr. et al. | ... | H05K 9/0015 277/920 |
| 5,194,696 A * | 3/1993 | Read | ................... | G11B 33/1466 277/626 |
| 5,793,566 A * | 8/1998 | Scura et al. | ....... | G11B 33/1466 360/99.18 |
| 5,847,317 A | 12/1998 | Phelps | | |
| 6,303,180 B1 | 10/2001 | Bunyan et al. | | |
| 6,312,550 B1 * | 11/2001 | Tiburtius et al. | .... | H05K 9/0015 156/292 |
| 6,323,418 B1 * | 11/2001 | Tiburtius et al. | .... | H05K 9/0015 361/818 |
| 6,392,838 B1 * | 5/2002 | Hearn et al. | ........ | G11B 33/1466 360/99.18 |
| 6,646,826 B1 * | 11/2003 | Haidari et al. | ..... | G11B 33/1466 360/99.22 |
| 6,889,984 B2 * | 5/2005 | Hatanaka | ........... | G11B 33/1466 360/99.18 |
| 6,930,858 B2 * | 8/2005 | Gunderson et al. | ........................ | G11B 33/1446 360/99.21 |
| 9,508,393 B1 * | 11/2016 | Le et al. | ............. | G11B 33/1466 |
| 10,537,048 B2 | 1/2020 | Bodette et al. | | |
| 2002/0153672 A1 * | 10/2002 | Caplain et al. | ....... | F16J 15/0893 277/608 |

(Continued)

FOREIGN PATENT DOCUMENTS

JP  2001229650 A * 8/2001 ............. G11B 25/04

*Primary Examiner* — Craig A. Renner
(74) *Attorney, Agent, or Firm* — Faegre Drinker Biddle & Reath

(57) ABSTRACT

An electronic device which includes a cover, a base coupled to the cover to create an enclosure, a conductive layer positioned between the cover and the base and arranged to reduce radiation from entering the enclosure, and a gasket positioned between the cover and the base to create a seal and positioned between the conductive layer and the enclosure.

19 Claims, 7 Drawing Sheets

(56) References Cited

U.S. PATENT DOCUMENTS

| | | |
|---|---|---|
| 2003/0222249 A1 | 12/2003 | Bunyan et al. |
| 2004/0057198 A1* | 3/2004 | Kahl et al. .......... H05K 9/0015 |
| | | 361/679.01 |
| 2004/0071970 A1* | 4/2004 | Kahl et al. .......... H05K 9/0015 |
| | | 204/192.15 |
| 2006/0098387 A1 | 5/2006 | Chandra et al. |
| 2010/0276193 A1 | 11/2010 | Liu |
| 2013/0014983 A1 | 1/2013 | Korson et al. |
| 2018/0301917 A1 | 10/2018 | Kvols |

* cited by examiner

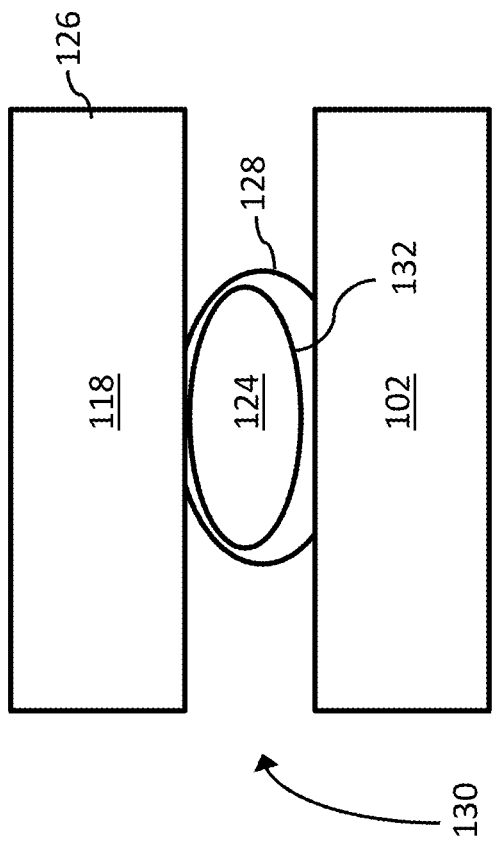
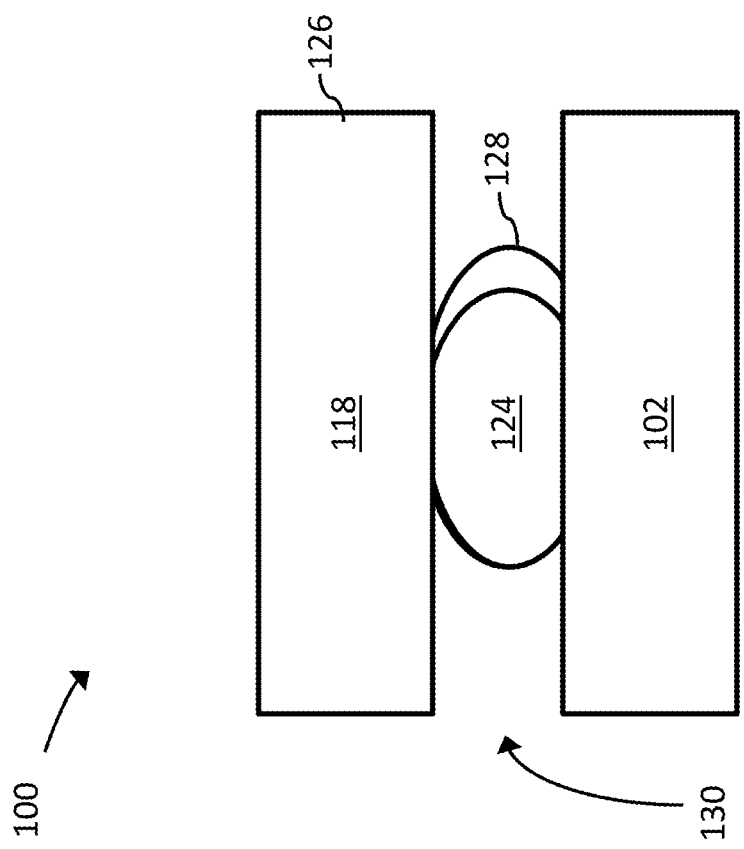
FIG. 3B
FIG. 3A

ELECTROMAGNETIC SHIELDING FOR ELECTRONIC DEVICES

SUMMARY

In certain embodiments, an electronic device includes a cover, a base coupled to the cover to create an enclosure, a conductive layer positioned between the cover and the base and arranged to reduce radiation from entering the enclosure, and a gasket positioned between the cover and the base to create a seal and positioned between the conductive layer and the enclosure.

In certain embodiments, a hard disk drive includes a cover, a base coupled to the cover to create an enclosure, data storage components positioned within the enclosure, a conductive layer positioned between the cover and the base and arranged to reduce radiation from entering the enclosure, and a gasket positioned between the cover and the base to seal the enclosure.

In certain embodiments, a method for forming a sealed enclosure between a cover and a base of an electronic device is disclosed. The method includes applying an uncured gasket material to the cover and/or the base, positioning a conductive layer within the gasket material or over the gasket material, and coupling the cover to the base to create the sealed enclosure.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 3A and FIG. 3B show cutaway, side views of a portion of the hard disk drive of FIG. 1 and the top cover of FIG. 2 and a gasket therebetween, in accordance with certain embodiments of the present disclosure.

Figure 1:
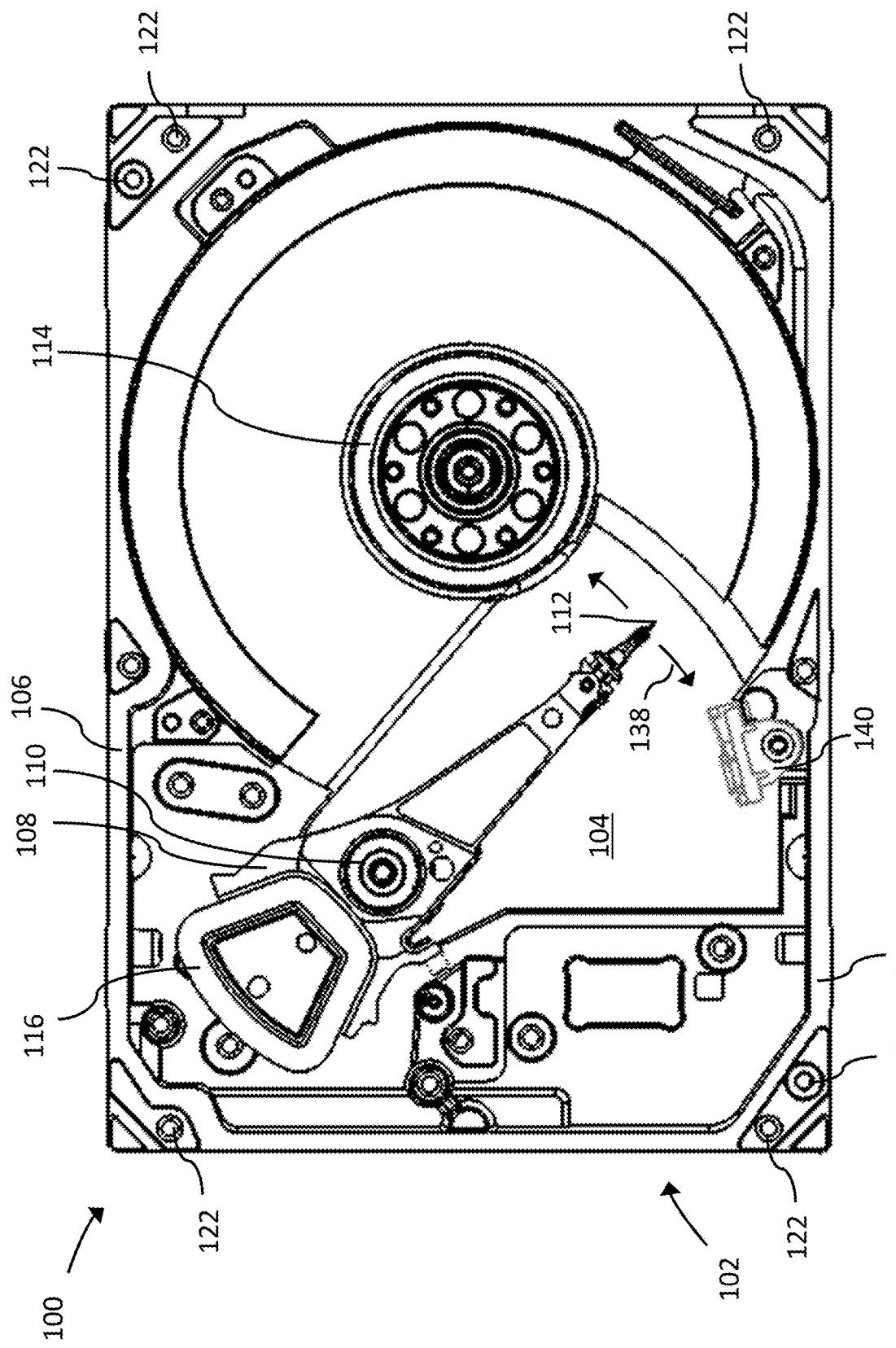
FIG. 1 shows a top view of portions of a hard disk drive, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Electronic devices such as data storage devices (e.g., hard disk drives and solid state drives) are sometimes operated in environments with significant electromagnetic radiation (e.g., radio-frequency radiation). Electromagnetic radiation can degrade performance of the electronic devices. For example, electromagnetic radiation can inhibit a hard disk drive's ability to read data from and write data to magnetic recording media and may ultimately cause the hard disk drive to fail. Certain embodiments of the present disclosure are accordingly directed to reducing the amount of electromagnetic radiation entering electronic devices.

FIG. 1 shows a hard disk drive 100. Although the description uses a hard disk drive 100 as an exemplary electronic device, the features for reducing electromagnetic radiation can be incorporated into other types of electronic devices and data storage devices.

Figure 2:
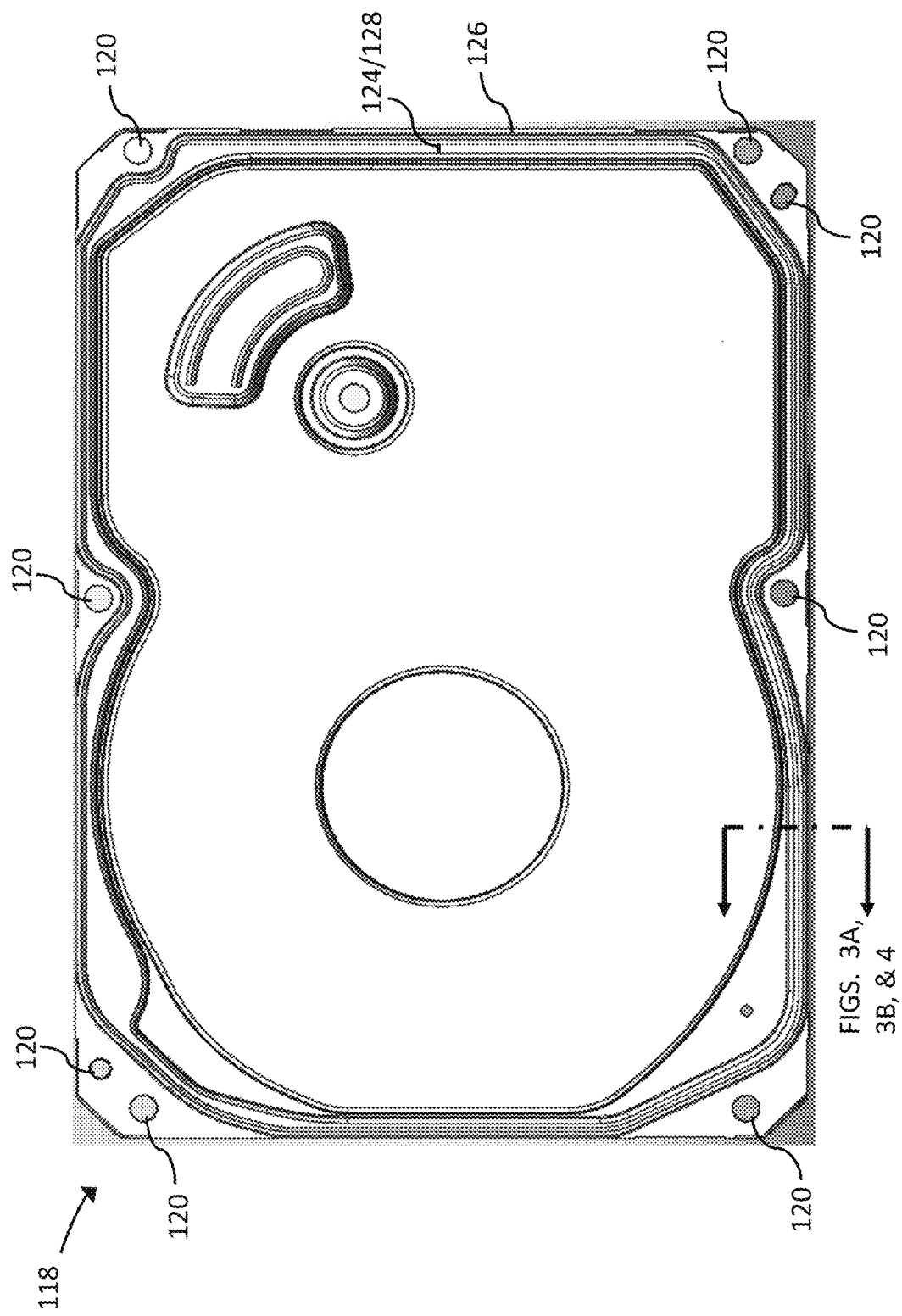
FIG. 2 shows a bottom view of a top cover for coupling to the hard disk drive of FIG. 1, in accordance with certain embodiments of the present disclosure.
Figure 6:
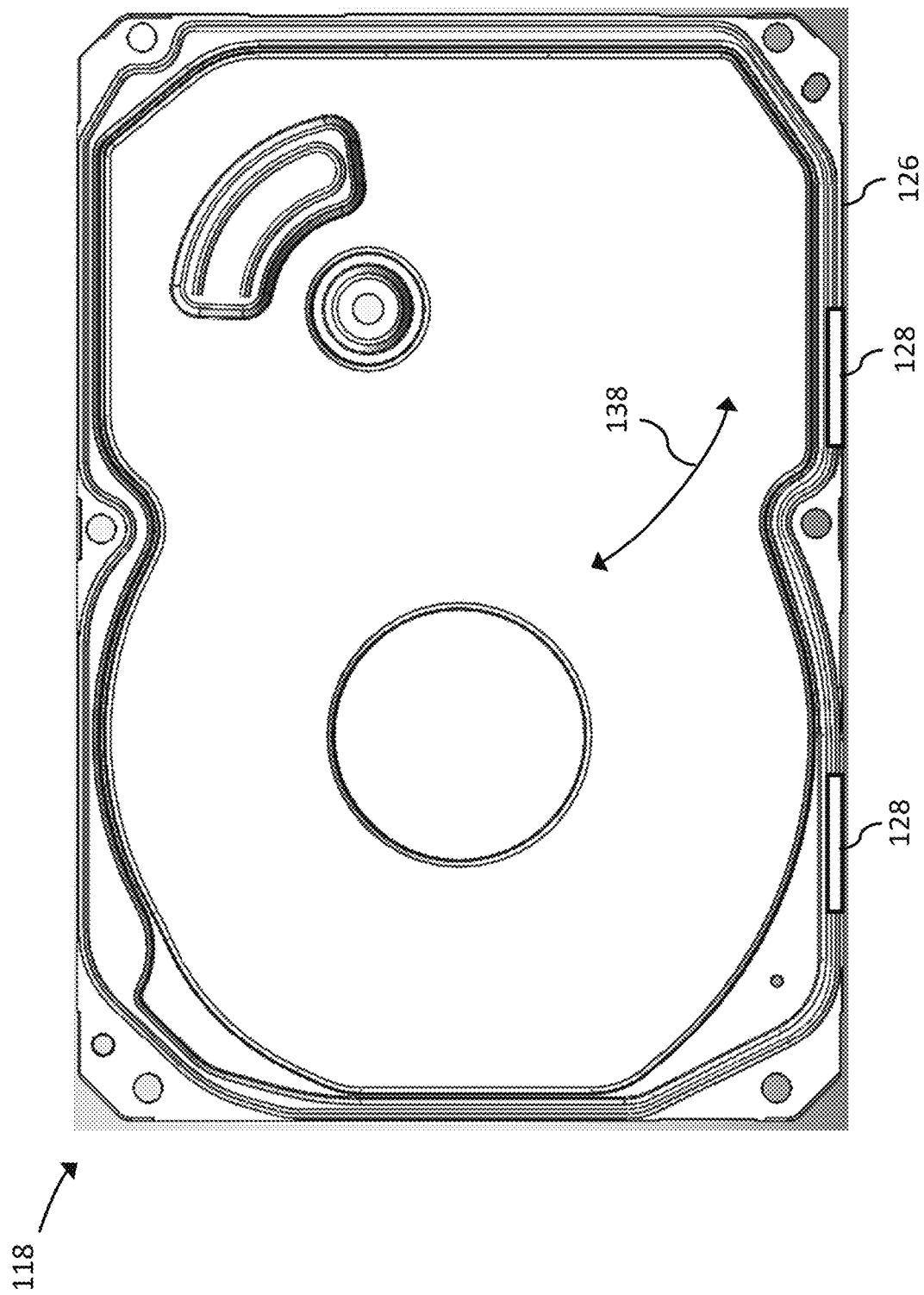
FIG. 6 shows a bottom view of a top cover for coupling to the hard disk drive of FIG. 1, in accordance with certain embodiments of the present disclosure.

The hard disk drive 100 includes a base deck 102 with a base member or a floor 104 with sidewalls 106 that form an internal cavity in which various hard disk drive components are positioned. As shown in FIG. 1, the sidewalls 106 extend around a periphery of the floor 104. When the hard disk drive 100 is assembled, a cover (examples of which are shown in FIGS. 2 and 6) is coupled to the base deck 102 to enclose the hard disk drive components within the internal cavity.

FIG. 1 shows the hard disk drive 100 with an actuator assembly 108, which can rotate around a pivot bearing 110. The actuator assembly 108 positions read/write heads 112 over data tracks on magnetic recording media (not shown). During operation, a spindle motor 114 rotates the magnetic recording media while the actuator assembly 108 is driven by a voice coil motor assembly (a coil portion 116 of which is shown in FIG. 1) to pivot around the pivot bearing 110. As the read/write heads 112 follow a travel path over the magnetic recording media, the read/write heads 112 write data to the magnetic recording media by generating and emitting a magnetic field towards the magnetic recording media which induces magnetically polarized transitions on the desired data track on the magnetic recording media. The magnetically polarized transitions are representative of the data. The read/write heads sense (or "read") the magnetically polarized transitions with a magnetic transducer. As the magnetic recording media rotates adjacent the read/write heads 112, the magnetically polarized transitions induce a varying magnetic field into a magnetic transducer of the read/write heads 112. The magnetic transducer converts the varying magnetic field into a read signal that is delivered to a preamplifier and then to a read channel for processing to be used by a host system (e.g., server, laptop computer, desktop computer).

As noted above, performance of electronic devices like the hard disk drive 100 can be degraded by electromagnetic radiation, which can be created by devices such as power supplies, antennas, mobile phone communications, AM and FM broadcasting, microwave ovens, etc. Electromagnetic radiation can leak into hard disk drives through gaps between the base deck and the cover. When electromagnetic radiation leaks into hard disk drives, the electromagnetic radiation negatively affects—in particular—the magnetoresistive elements of read/write heads. For example, electromagnetic radiation can interfere with the performance of the magnetoresistive elements and cause the read/write heads to not read data properly from the magnetic recording media.

To reduce the amount of electromagnetic radiation that leaks into the hard disk drive 100 (or other electronic devices), the present disclosure describes various approaches that incorporate radiation-blocking materials such as materials with conductive properties.

FIG. 2 shows a bottom side of a cover 118 that can be coupled (e.g., via fasteners such as screws) to the base deck 102 to create an enclosure. When the cover 118 is coupled to the base deck 102, the bottom surface of the cover 118 faces the base deck 102. The cover 118 can include openings 120 through which the fasteners extend within and then couple to openings 122 (shown in FIG. 1) in the base deck 102. Before the cover 118 is coupled to the base deck 102 via the fasteners, a gasket 124 can be positioned on the cover 118 near an outer periphery 126 of the cover 118. In certain embodiments, the gasket 124 is a form-in-place gasket (FIPG) that is applied to the cover 118 in an uncured state and that later cures. When the cover 118 is coupled to the base deck 102, the gasket 124 helps provide a seal (e.g., an air-tight seal) to help prevent contaminants from entering the enclosure of the hard disk drive 100. However, the gasket 124 itself may not help prevent electromagnetic radiation from leaking into the enclosure of the hard disk drive 100. Instead, given its physical dimensions and position between the base deck 102 and the cover 118, the gasket 124 may create a path for electromagnetic radiation to leak into the enclosure of the hard disk drive 100.

As such, the hard disk drive 100 can include one or more conductive layers 128 to help block electromagnetic radiation. FIGS. 3A, 3B, 4, and 5 show example arrangements of the conductive layer 128 with respect to the gasket 124.

FIG. 3A shows a side, cutaway view of the gasket 124 positioned between the base deck 102 (e.g., an upper surface of the sidewalls 106) and the cover 118 to create a seal. The conductive layer 128 is also positioned between the base deck 102 and the cover 118. The conductive layer 128 is positioned closer to the outer periphery 126 of the cover 118 and/or the base deck 102 than the gasket 124. Put another way, electromagnetic radiation would impinge the conductive layer 128 before the gasket 124. As such, the gasket 124 is positioned between the conductive layer 128 and an internal enclosure 130 of the hard disk drive 100.

FIG. 3B shows a side, cutaway view of the gasket 124 positioned between the base deck 102 (e.g., an upper surface of the sidewalls 106) and the cover 118 to create a seal. The conductive layer 128 is also positioned between the base deck 102 and the cover 118. The conductive layer 128 partially covers an outer periphery 132 of the gasket 124. As shown when comparing FIG. 3B to FIG. 3A, the conductive layer 128 in FIG. 3A is positioned such that the gasket 124 contacts both the base deck 102 and the cover 118 which can provide better sealing than the arrangement of FIG. 3B.

In both arrangements shown in FIGS. 3A and 3B, the conductive layer 128 can comprise a polymer- or elastomer-based material, which includes one or more filler or additive materials that are conductive (e.g., silver, copper, gold, aluminum). The particular conductive materials for a given application can be formulated for a target frequency range electromagnetic radiation. The conductive layer 128 can be considered to have conductive properties, and the gasket 124 can be non-conductive. As such, the gasket 124 does not need to be modified to incorporate conductive materials or conductive fillers and can be formulated for sealing and manufacturability properties. When the hard disk drive 100 is assembled, the conductive layer 128 helps block electromagnetic radiation from entering the enclosure 130 of the hard disk drive 100 and the gasket 124 helps seal the enclosure of the hard disk drive 100.

In certain embodiments, to limit the effect on the gasket's sealing ability, the conductive layer 128 has a thickness that is 50% or less of a thickness of the gasket 124 (e.g., the thickness of conductive layer 128 is 10-50% of the thickness of the gasket 124). In certain embodiments, the conductive layer 128 is a coating that is applied by spraying or dispensing the conductive layer 128 on the gasket 124 and/or the cover 118. The conductive layer 128 can be applied after the gasket 124 has cured to avoid affecting the formulation and/or sealing ability of the gasket 124. In certain embodiments, the conductive layer 128 is a continuous layer along an entire periphery of the base deck 102 and/or the cover 118. As will be described in more detail below, in other embodiments, the conductive layer 128 is not continuous along the entire periphery of the base deck 102 and/or the cover 118.

Figure 4:
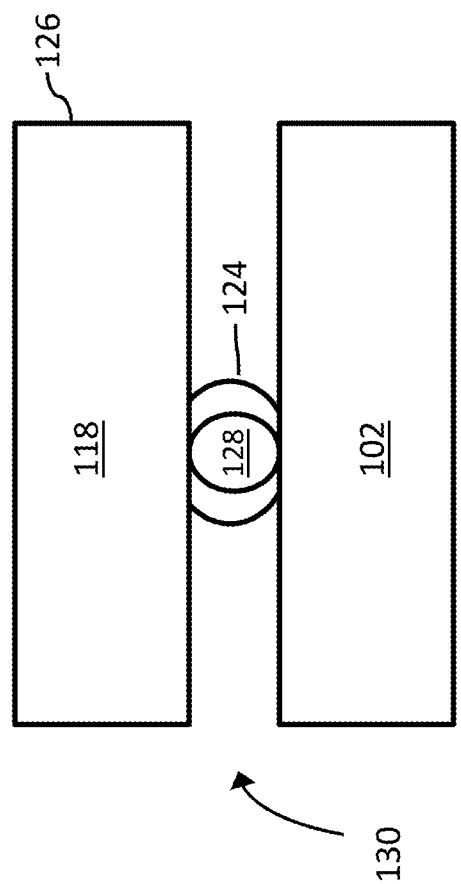
FIG. 4 shows a cutaway, side view of a portion of the hard disk drive of FIG. 1 and the top cover of FIG. 2 and an alternative gasket therebetween, in accordance with certain embodiments of the present disclosure.

FIG. 4 shows a side, cutaway view of the gasket 124 positioned between the base deck 102 and the cover 118 to create a seal. The conductive layer 128 is also positioned between the base deck 102 and the cover 118. In the approach shown in FIG. 4, the conductive layer 128 is in the form of a conductive wire. For the purposes of describing FIGS. 4 and 5, the conductive layer 128 will be referred to as the conductive wire 128. In certain embodiments, the conductive wire 128 is preformed such that the conductive wire 128 is shaped and sized to be positioned around the periphery of the base deck 102 and/or the cover 118. The conductive wire 128 can comprise a metal material such as conductive metals like steel, aluminum, silver, copper, and gold. The particular conductive materials for a given application can be formulated for a target frequency range electromagnetic radiation. Like the examples shown in FIGS. 3A and 3B, when the hard disk drive 100 is assembled, the conductive wire 128 helps block electromagnetic radiation from entering the enclosure 130 of the hard disk drive 100 and the gasket 124 helps seal the enclosure of the hard disk drive 100.

After the gasket 124 is applied to the cover 118, but before curing, the conductive wire 128 can be at least partially immersed into the uncured material of the gasket 124. For example, the conductive wire 128 can be placed in the uncured gasket material within seconds of the gasket material being dispensed. After curing, the gasket 124 can surround the conductive wire 128 in certain places along the periphery of the base deck 102 and/or the cover 118. For example, as shown in FIG. 4, the conductive wire 128 can directly contact the base deck 102 (e.g., an upper surface of the sidewalls 106) and the cover 118, and the gasket 124 can surround the surfaces of the conductive wire 128 that are not in contact with the base deck 102 and the cover 118. FIG. 4 also shows that the gasket 124 can directly contact the base deck 102 and the cover 118 on both sides of the conductive wire 128. Due to the conductive wire's solid form, the addition of the conductive wire 128 may improve the seal between the base deck 102 and the cover 118 such that the seal has a higher resistance to permeability towards surrounding air, moisture, and vapor-form contamination external to the hard disk drive 100.

Figure 5:
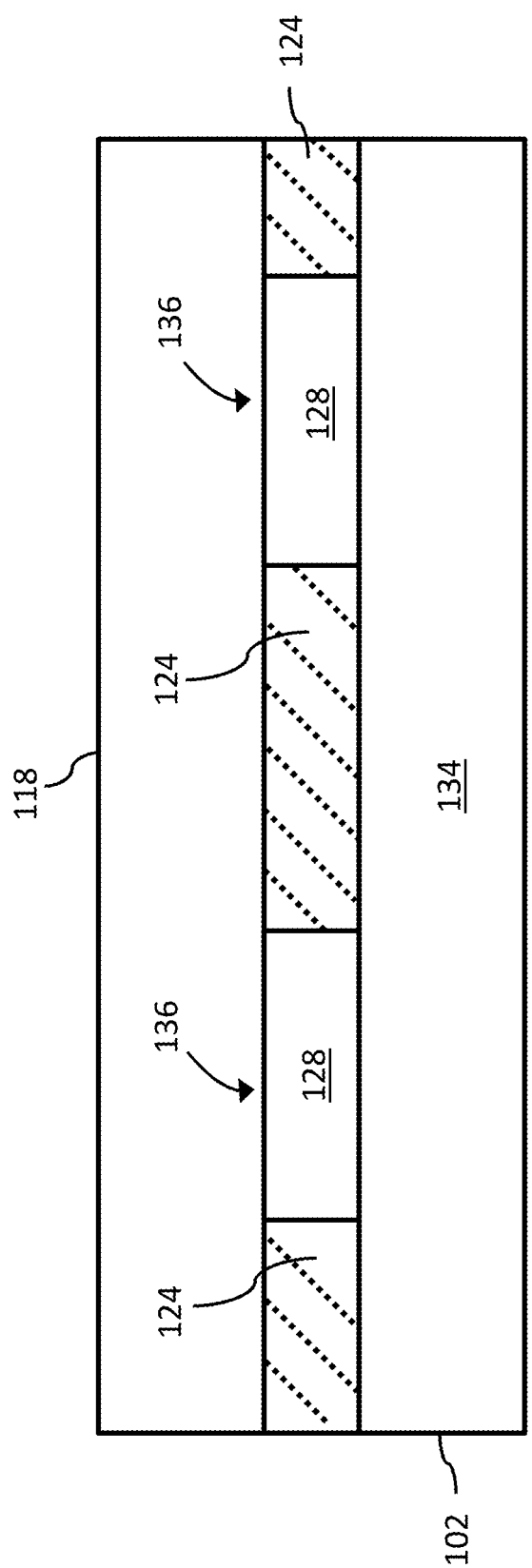
FIG. 5 shows a side view of the hard disk drive, the top cover, and the gasket shown in FIG. 4, in accordance with certain embodiments of the present disclosure.

FIG. 5 shows a side view of an exterior-facing surface 134 of the hard disk drive 100 with the conductive-wire approach shown in FIG. 4 and described above. As shown in FIG. 5, as the conductive wire 128 extends along the periphery of the base deck 102 and/or the cover 118, certain portions (represented as exposed portions 136 in FIG. 5) of the conductive wire 128 are not fully embedded in the gasket 124. Instead, the conductive wire 128 can be only partially embedded in the gasket 124 along the periphery of the base deck 102 and/or the cover 118.

FIG. 6 shows an alternative arrangement of the conductive layer 128 compared to the arrangement shown in FIG. 2. The arrangement of the conductive layer 128 in FIG. 6 can incorporate any one the approaches shown in FIGS. 3A, 3B, 4, and 5.

As shown in FIG. 6, the conductive layer 128 is positioned along the periphery of the cover 118 at one or more limited or targeted portions of the periphery. The conductive layer 128 can also be positioned along the periphery of the base deck 102. As noted above, electromagnetic radiation has the most significant effect on the read/write heads 112. To reduce the overall cost of the hard disk drive 100 while still reducing the effect of electromagnetic radiation, the conductive layer 128 can be positioned along only parts of the outer periphery 126 of the cover 118 and/or the base deck 102. For example, the conductive layer 128 can be positioned adjacent to a travel path 138 (as represented by the arrow in FIG. 6 and FIG. 1) of the read/write heads 112 (as shown in FIG. 1). The travel path 138 can include travel along a parking ramp 140 (as shown in FIG. 1) on which the read/write heads 112 rest when the hard disk drive 100 is idling or not operating. Additionally or alternatively, the conductive layer 128 can be positioned at points along the periphery of the base deck 102 and/or the cover 118 where electromagnetic radiation is most likely to leak into the hard disk drive 100. For example, the fasteners that couple the cover 118 to the base deck 102 are conductive but areas between the fasteners do not otherwise include conductive material, so the conductive layer 128 can be positioned between the fasteners. As another example, the conductive layer 128 can be positioned where the thickness of the sidewalls 106 is reduced relative to other portions of the sidewalls 106. With the conductive layer 128 positioned only at portions along the base deck 102 and/or the cover 118, the conductive layer 128 can be considered to be non-continuous with respect to the entire periphery of the base deck 102 and/or the cover 118. Although the conductive layer 128 may be positioned at limited areas, the gasket 124 can still be positioned along the entire periphery of the base deck 102 and/or the cover 118. Further, the conductive layer 128 can be positioned such that the conductive layer 128 does not extend outside the outer periphery of the base deck 102 and/or the cover 118.

In certain embodiments, the conductive layer 128 in the example of FIG. 6 can comprise a coating as shown in and described with respect to FIGS. 3A and 3B. In certain embodiments, the conductive layer 128 in the example of FIG. 6 can be a conductive wire as shown in and described with respect to FIGS. 4 and 5. The conductive layer 128 can be dispensed at limited areas along the base deck 102 and/or the cover 118.

Figure 7:
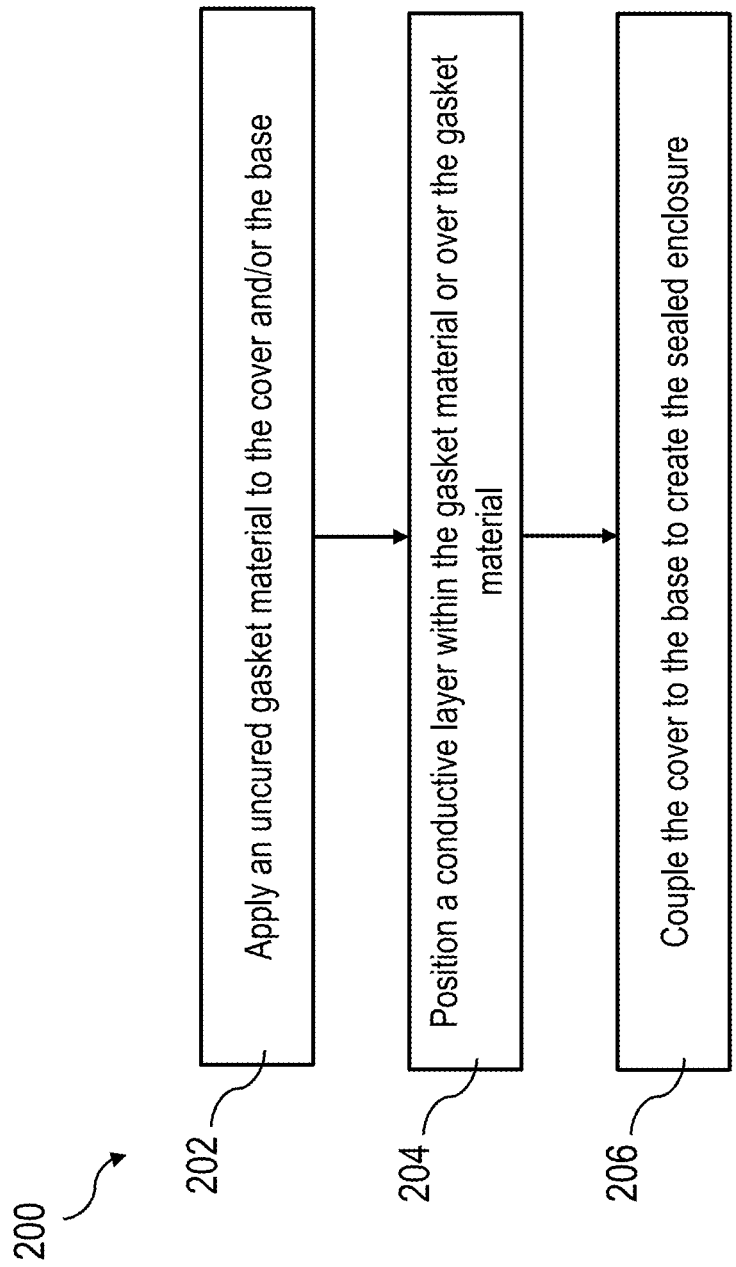
FIG. 7 shows a block diagram of sealing a hard disk drive, in accordance with certain embodiments of the present disclosure.

FIG. 7 shows a block diagram of a method 200 for sealing the hard disk drive 100. The method 200 includes applying the material of the gasket 124 in its uncured state to the cover and/or the base (block 202 in FIG. 7). The method 200 also includes positioning the conductive layer 128 within the material of the gasket or over the material of the gasket 124 (block 204 in FIG. 7). The method 200 further includes coupling the cover 118 to the base deck 102 to create the sealed enclosure 130 (block 206 in FIG. 7).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. An electronic device comprising:
a cover;
a base coupled to the cover to create an enclosure;
a conductive layer positioned between the cover and the base and arranged to reduce radiation from entering the enclosure, the conductive layer comprising a conductive filler and a polymer or elastomer, the conductive layer being non-continuous as the conductive layer extends along an outer periphery of the cover; and
a gasket positioned between the cover and the base to create a seal and positioned between the conductive layer and the enclosure, the gasket comprising a non-conductive material.

2. The electronic device of claim 1, wherein the electronic device is a hard disk drive that includes a read/write head.

3. The electronic device of claim 2, wherein the hard disk drive includes the conductive layer only along the cover and the base adjacent to a travel path of the read/write head.

4. The electronic device of claim 1, wherein the conductive layer has a thickness that is less than 50% of a thickness of the gasket.

5. The electronic device of claim 1, wherein the non-continuous layer comprises separate sections along an outer periphery of the cover.

6. The electronic device of claim 5, wherein the separate sections extend longitudinally and parallel with respect to an outer edge of the cover.

7. The electronic device of claim 5, wherein the gasket extends around the entire outer periphery of the cover.

8. The electronic device of claim 5, wherein the separate sections are positioned to be adjacent to portions of the base with reduced sidewall thickness.

9. A hard disk drive comprising:
a cover;
a base coupled to the cover to create an enclosure;
data storage components positioned within the enclosure;
a conductive wire positioned between the cover and the base, in contact with both the cover and the base, and arranged to reduce radiation from entering the enclosure; and
a gasket positioned between the cover and the base to seal the enclosure.

10. The hard disk drive of claim 9, wherein the data storage components include a read/write head arranged to follow a travel path, wherein the conductive wire is positioned adjacent the travel path.

11. The hard disk drive of claim 10, wherein the conductive wire is positioned only adjacent the travel path.

12. The hard disk drive of claim 9, wherein the conductive wire is a pre-formed shape.

13. The hard disk drive of claim 9, wherein the conductive wire extends around an entire periphery of the base and the cover.

14. The hard disk drive of claim 9, wherein the conductive wire is only partially embedded in the gasket.

15. The hard disk drive of claim 9, wherein the conductive wire is at least partially embedded in the gasket.

16. A method for forming a sealed enclosure between a cover and a base of an electronic device, the method comprising:
 applying an uncured gasket material to the cover and/or the base;
 positioning a conductive wire within the gasket material; and
 coupling the cover to the base to create the sealed enclosure.

17. The method of claim 16, wherein positioning the conductive wire within the gasket material includes at least partially immersing the conductive wire into the gasket material.

18. The method of claim 16, wherein the conductive wire contacts both the cover and the base.

19. The electronic device of claim 1, wherein the conductive layer is a coating on the gasket.

\* \* \* \* \*